(12) United States Patent
Onizuka et al.

(10) Patent No.: US 6,611,066 B2
(45) Date of Patent: Aug. 26, 2003

(54) POWER DISTRIBUTOR FOR VEHICLE

(75) Inventors: Takahiro Onizuka, Nagoya (JP); Isao Isshiki, Nagoya (JP)

(73) Assignees: Autonetworks Technologies, Ltd., Nagoya (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 193 days.

(21) Appl. No.: 09/839,213

(22) Filed: Apr. 23, 2001

(65) Prior Publication Data

US 2001/0045777 A1 Nov. 29, 2001

(30) Foreign Application Priority Data

May 16, 2000 (JP) ........................................ 2000-143716

(51) Int. Cl.[7] .................................................. B60L 1/00
(52) U.S. Cl. ...................... 307/9.1; 307/10.7; 307/10.8; 307/42
(58) Field of Search .......................... 307/9.1, 42, 10.7, 307/10.8

(56) References Cited

U.S. PATENT DOCUMENTS 5,311,398 A * 5/1994 Schirmer et al. ............ 361/704
5,324,989 A * 6/1994 Thornton ...................... 307/32
5,414,220 A * 5/1995 Hanato et al. ............... 174/254
6,152,752 A * 11/2000 Fukuda ........................ 439/275
6,402,569 B1 * 6/2002 Spadoni et al. .............. 439/723

FOREIGN PATENT DOCUMENTS

JP A 10-126963 5/1998

\* cited by examiner

Primary Examiner—Brian Sircus
Assistant Examiner—Robert L. DeBeradinis
(74) Attorney, Agent, or Firm—Oliff & Berridge, PLC

(57) ABSTRACT

In a power distributor for a vehicle, each of semiconductor switching elements 14 is disposed between an input terminal 10 and corresponding one of a plurality of output terminals 12. The semiconductor switching elements 14 are disposed in one direction and a control circuit board 18 is provided thereon. The input terminal 10, the output terminals 12 and board terminals 16 coupled to the control circuit board 18 are disposed in parallel to the arrangement direction of the semiconductor switching elements 14 and protruded from the casing 22 in the same direction to thereby directly form a connector.

11 Claims, 6 Drawing Sheets

POWER DISTRIBUTOR FOR VEHICLE

BACKGROUND OF THE INVENTION

1. Field of the Invention

The present invention relates to a power distributor for distributing electric power supplied from a power source such as a battery etc. mounted on a vehicle to a plurality of vehicle-mounted loads.

2. Description of the Related Art

Conventionally, as a means for distributing electric power supplied from a power source mounted on a vehicle to a plurality of vehicle-mounted loads, an electric coupling box is generally known in which a plurality of bus bar substrates are laminated to form a power distribution circuit, and fuses and relay switches are incorporated on the power distribution circuit.

Further, in recent years, in order to realize the miniaturization and high-speed switching control of such an electric coupling box, a power distributor has been developed in which each of semiconductor switching elements such as FETs etc. is disposed between an input terminal and an output terminal and each of the semiconductor switching elements is turned on and off by a control circuit incorporated in a control circuit board.

For example, Japanese Patent Laid-Open No. 126963/1998 discloses a power distributor which is arranged in a manner that a plurality of semiconductor switching elements (chips) are mounted on a control circuit board, then the conduction control terminals (control signal input terminals) of the semiconductor switching elements are connected to the control circuit of the control circuit board, then the input side conduction terminals of the respective semiconductor switching elements are connected to a power source through a common power source input terminal, and the output side conduction terminals of the respective semiconductor switching elements are connected to respective vehicle-mounted loads through power source output terminals.

However, according to the apparatus disclosed in this publication, since an external connection connector is provided in addition to the control circuit board, the input terminals and the output terminals, a special space is required for disposing the connector and further it is required to connect the connector to the control circuit board and the respective terminals by inner wirings. Thus, it is very difficult to miniaturize the entire size of the apparatus.

Further, according to this apparatus, since the respective semiconductor switching elements are mounted on the control circuit board, it is difficult to perform the heat dissipation (cooling) of the respective semiconductor switching elements. Thus, there may arise a case that the heat badly influences on other circuit elements mounted on the control circuit board.

As a means for avoiding such an inconvenience, it is considered to employ such a technique that the semiconductor switching elements are disposed at a portion other than the control circuit board and the semiconductor switching elements are connected to the control circuit board through a suitable connecting member. However, according to such a technique, it is further difficult to miniaturize the entire size of the apparatus.

SUMMARY OF THE INVENTION

Accordingly, the invention has been made in view of the aforesaid circumstances of the conventional technique, and an object of the invention is to provide a power distributor for a vehicle which can distribute electric power to a plurality of vehicle-mounted loads with a simple and compact configuration while a control circuit board is disposed separately from semiconductor switching elements.

To achieve the above object, according to the invention, there is provided a power distributor for a vehicle which distributes electric power supplied from a power source mounted on the vehicle to a plurality of vehicle-mounted loads, the power distributor comprising:

an input terminal coupled to the power source;

a plurality of output terminals coupled to the vehicle-mounted loads, respectively;

semiconductor switching elements disposed between the input terminal and the plurality of output terminals, respectively;

a control circuit board, disposed above the semiconductor switching elements, in which a control circuit is incorporated which controls on and off states of each of the semiconductor switching elements in accordance with a command signal inputted from outside;

board terminals for electrically connecting the control circuit to an external circuit; and a casing for housing therein the semiconductor switching elements and the control circuit board, wherein the semiconductor switching elements are disposed in one direction, the input terminal, the output terminals and the board terminals are disposed in parallel to an arrangement direction of the semiconductor switching elements, and the input terminal, the output terminals and the board terminals are protruded in a same direction from the casing to form a connector.

According to such a configuration, since the input terminal, the output terminals and the board terminals are disposed in parallel to the arrangement direction of the semiconductor switching elements and are protruded in the same direction from the casing to thereby directly form a connector, the entire size of the power distributor can be reduced largely. In particular, the width of the power distributor (the size of the power distributor along the direction perpendicular to the arrangement direction of the semiconductor switching elements) can be reduced largely. Thus, the entire size of the power distributor can be reduced to a large extent whilst the semiconductor switching elements are disposed separately from the control circuit board.

Further, when the semiconductor switching elements are disposed separately from the control circuit board as described above, the semiconductor switching elements can be positively cooled easily. For example, when the power distributor is arranged in a manner that a heat dissipation member is fixed to the lower surface of the casing in a state that the heat dissipation member is exposed outside of the casing so that the heat dissipation member is coupled to the semiconductor switching elements so as to be able to transmit heat therebetween, the respective semiconductor switching elements can be collectively cooled more efficiently.

In this respect, a coupling means between the input and output terminals and the control circuit board may be configured in a manner that tabs are raised from the respective terminals and coupled to the control circuit board. However, in this case, it is required an extra space for forming the tabs. In contrast, when the power distributor is arranged in a manner that the conduction control terminals of the respective semiconductor switching elements are coupled to the control circuit of the control circuit board through the flexible wiring member, the respective terminals can be coupled to the control circuit board with a more compact configuration.

In this case, the conduction control terminals of the respective semiconductor switching elements may be coupled to the flexible wiring member by directly coupling them to each other. In contrast, the power distributor may be arranged to further include control terminals which are disposed alternately with the output terminals and electrically coupled to the conduction control terminals of the semiconductor switching elements, respectively, and the control terminals may be coupled to the control circuit of the control circuit board through the flexible wiring member. In this case, the electrical coupling between the flexible wiring member and the respective conduction control terminals can be performed more simply and easily.

Although the number of the flexible wiring member is not limited, when such a flexible wiring member is employed, it is possible to electrically couple all the respective conduction control terminals to the control circuit by a sheet of the flexible wiring member, for example. In this case, the entire configuration of the power distributor can be more simplified.

Further, as well as the electrical coupling between the conduction control terminals and the control circuit, the control circuit is electrically coupled to the input terminal and the output terminals through the flexible wiring member, and the control circuit is arranged to, when a current value obtained from a voltage difference between the input terminal and one of the output terminals is equal to or more than a predetermined value, forcedly turn off the semiconductor switching element coupled to the one of the output terminals. In this case, each of the semiconductor switching elements can be provided with a fuse function by a simple wiring configuration.

In the invention, the concrete configurations of the respective terminals can be set suitably. For example, each of the board terminals may be formed by bending it at a center portion thereof to form almost a right angle between bent portions, wherein one ends of the board terminals are coupled to the control circuit of the control circuit board and other ends of the board terminals are disposed to protrude in a same direction as the input terminal and the output terminals. In this case, the electric coupling between the control circuit board and an external circuit can be realized reasonably with a simple configuration and further the entire size of the power distributor can be further miniaturized.

Further, when the semiconductor switching elements, the input terminal and the output terminals are disposed on the substantially same plane, and the control circuit board is disposed so as to be almost in parallel to the plane, not only the width of the power distributor but also the height thereof can be reduced largely (that is, the reduction in thickness can be realized).

Further, when the power distributor is arranged to further include a conduction plate on which the semiconductor switching elements are mounted and which is electrically coupled to input side conduction terminals of the semiconductor switching elements, and the conduction plate and the input terminal are formed by a common single metal plate, the number of the conductors constituting the circuit can be further reduced to thereby simplify the configuration and also the thickness of the power distributor can be further reduced.

Further, it is possible to mold the input terminal, the output terminals and the board terminals integrally with the casing. In this case, the entire configuration of the power distributor can be further simplified.

Furthermore, when a connector housing portion covering the input terminal, the output terminals and the board terminals is formed integrally with one side surface of the main body of the casing, the respective terminals can be surely protected and the respective terminals can be coupled to the connector on the external wiring side more simply.

DETAILED DESCRIPTION OF THE PREFERRED EMBODIMENTS

The preferred embodiment of the invention will be explained with reference to the accompanying drawings.

Figure 1:
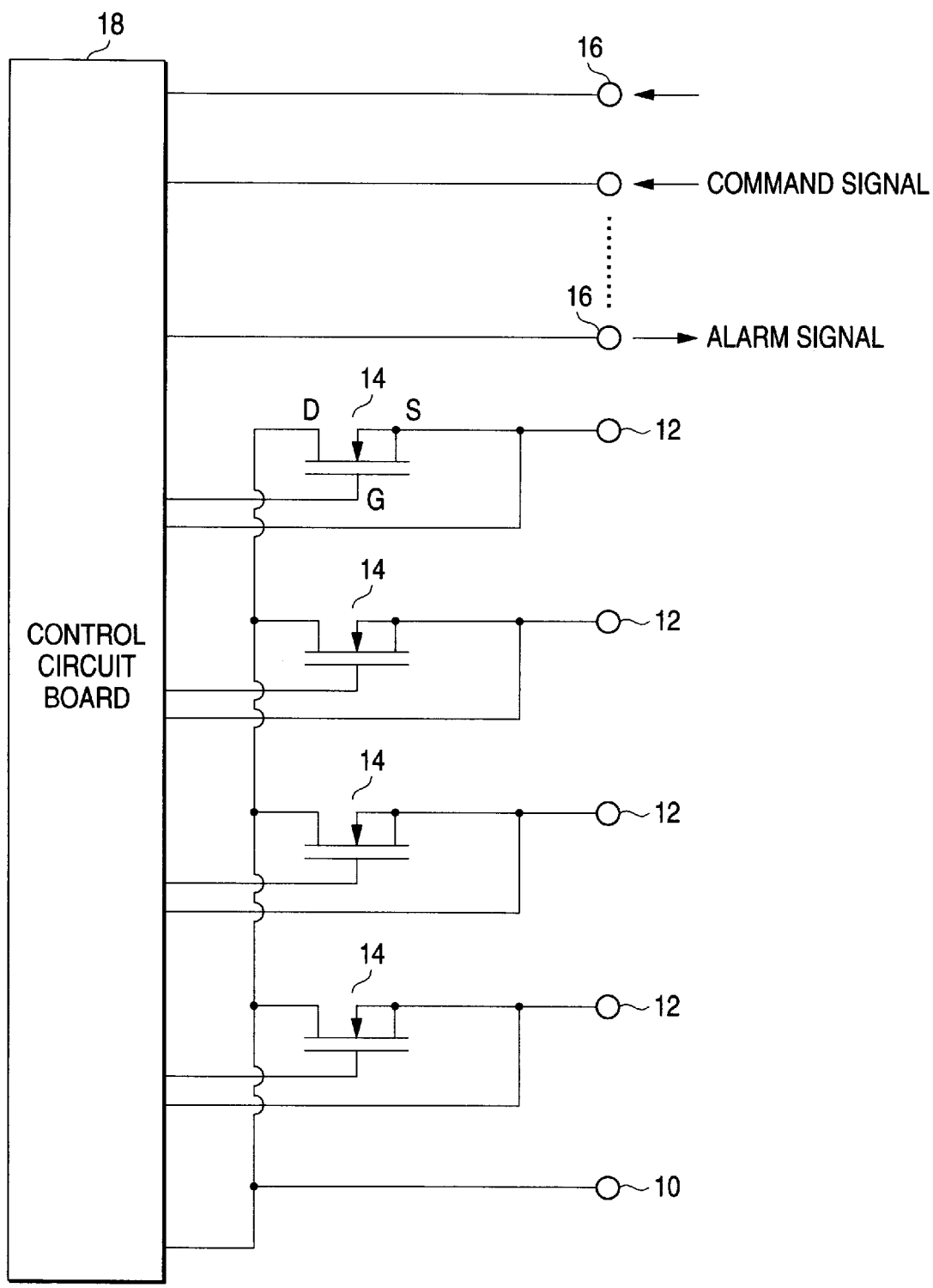
FIG. 1 is a circuit diagram showing a power distributor for a vehicle according to an embodiment of the present invention.

First, the circuit configuration of the power distributor for a vehicle according to the embodiment will be explained with reference to FIG. 1.

The power distributor includes an input terminal 10 connected to the battery and a plurality of (four in the example shown in the figure) output terminals 12. Semiconductor switching elements (power MOSFETs (hereinafter merely referred to "FETs" 14 in the example shown in the figure) are disposed between the input terminal 10 and the output terminals 12, respectively. To be more concrete, the input side conduction terminals (drains) of the respective FETs 14 are connected to the common input terminal 10, and the output side conduction terminals (sources) of the respective FETs 14 are connected to the corresponding output terminals 12, respectively.

The conduction control terminals (gates) of the respective FETs 14 are all connected to the control circuit of a control circuit board 18. The power source voltage applied to the input terminal 10 and the source voltages of the respective FETs 14 are applied to the control circuit. The control circuit is configured to control the conduction states of the respective FETs 14 based on operation signals (switch signals etc.) inputted from the outside through board terminals 16. The control circuit is further configured to detect currents flowing through the respective FETs based on voltage differences between the voltage of the power source and the source voltages of the respective FETs 14, then to turn off the FET 14 and further output an alarm signal to a not-shown display apparatus through the board terminal 16 when the detected current relating to this FET exceeds an allowable range.

The specific configuration of the power distributor for a vehicle for realizing the circuit arrangement of FIG. 1 will be explained with reference to FIGS. 2 to 6.

Figure 2:
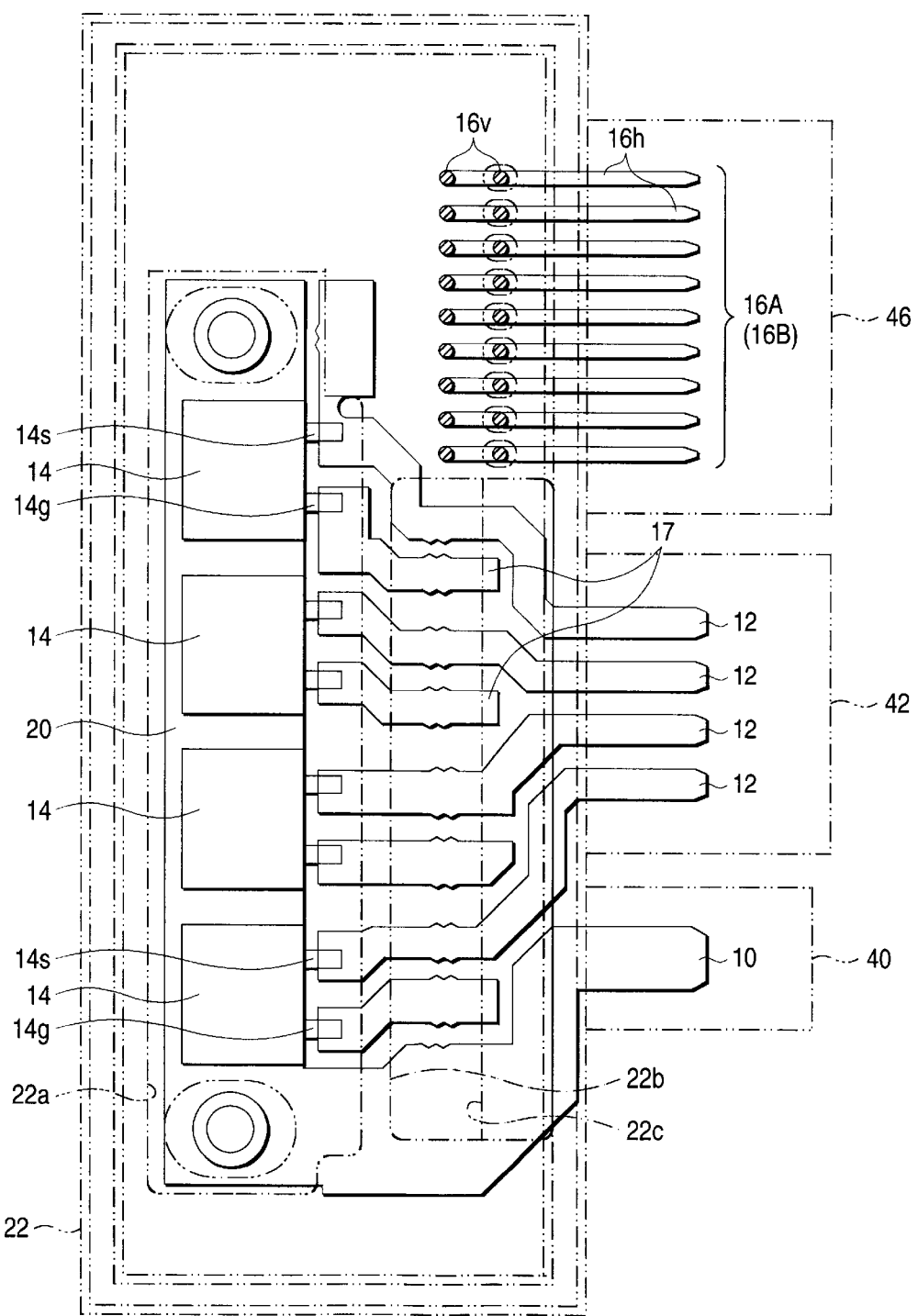
FIG. 2 is a plan view showing the power distributor when seeing through a casing.

As shown in FIG. 2, the input terminal 10 and the output terminals 12 are each formed in a strip shape and are disposed in a line in a state that they are all protruded in the same direction (right direction in the figure). Further, control terminals 17 also each formed in a strip shape are disposed in a line in adjacent to the output terminals 12 such that the control terminals 17 and the output terminals 12 are disposed alternatively. The input terminal 10 is disposed at the outside (lower side in FIG. 2) of these control terminals and the output terminals.

At the inner side (left side in FIG. 2) of these terminals 10, 12, 17, a drain coupling plate (conduction plate) 20 extending to the arrangement direction of these terminals is disposed. The drain coupling plate 20 and the input terminal 10 are formed by a single metal plate. That is, the input terminal 10, the output terminals 12 and the control terminals 17 are arranged at the side portion of the drain coupling plate 20 along the longitudinal direction thereof in a state that the drain coupling plate 20 and the input terminal 10 are coupled integrally. The FETs 14 are disposed and mounted on the drain coupling plate 20 along the longitudinal direction thereof (that is, the arrangement direction of the respective terminals).

Of the respective terminals of the FETs 14, drain terminals 14d serving as the input side conduction terminals are formed so as to be exposed on the rear surface of a chip body, whilst source terminals 14s serving as the output side conduction terminals and gate terminals 14g serving as the conduction control terminals protrude in the same direction from the side surface of the chip body. The FETs 14 are disposed on the drain coupling plate 20 in a line with the arrangement and pitch which correspond to the arrangement and pitch of the output terminals 12 and the control terminals 17, respectively. The FETs 14 are mounted on the drain coupling plate 20 by the welding process etc. (for example, the soldering process) in a state that the drain terminals 14d of the FETs 14 contact directly on the drain coupling plate 20. Further, the source terminals 14s and the gate terminals 14g of the FETs 14 are electrically connected to the rear ends of the output terminals 12 and the rear ends of the control terminals 17 by such means as the soldering, respectively.

Figure 3:
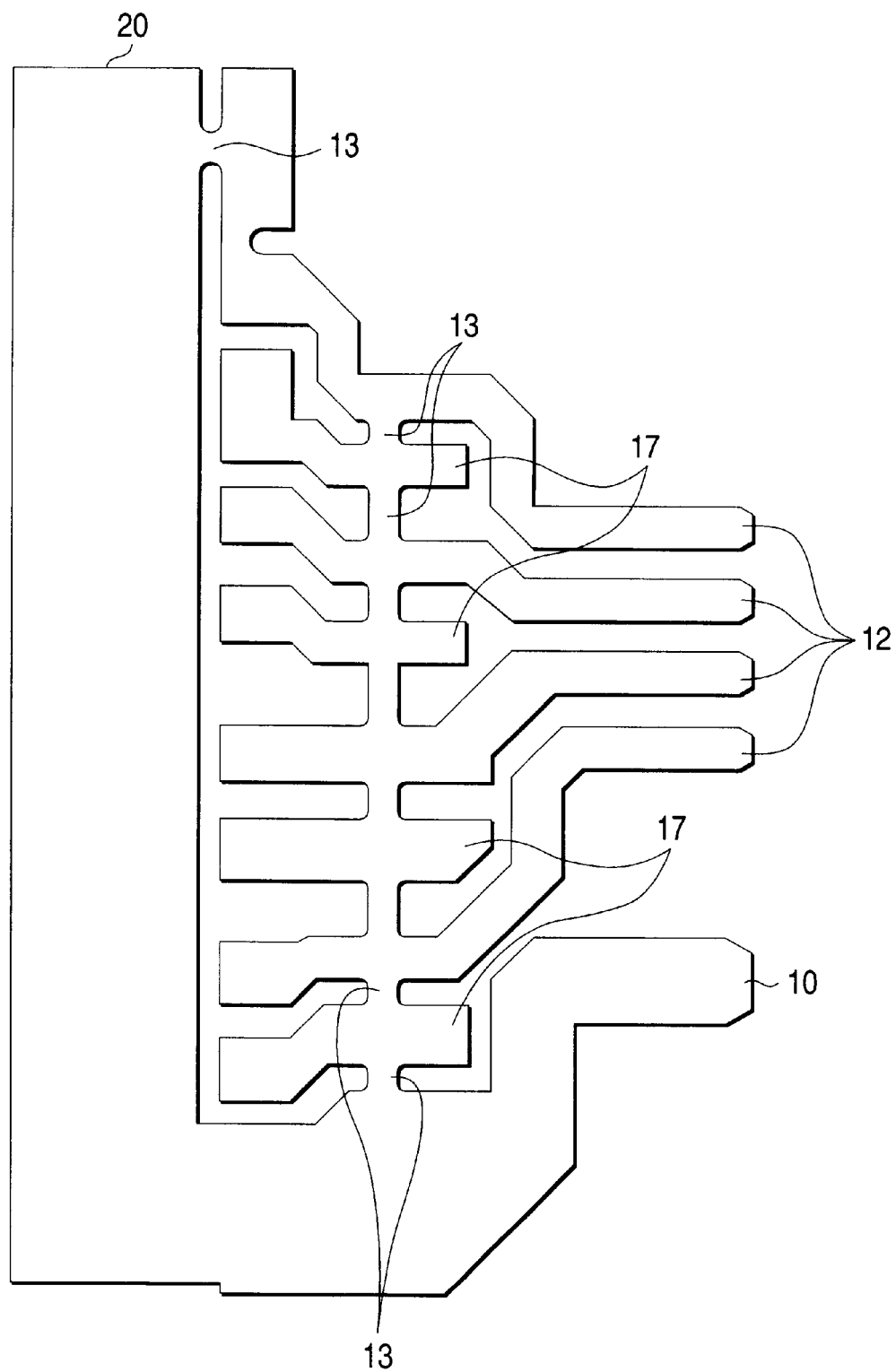
FIG. 3 is a plan view showing an original plate of semiconductor that constitutes the power distributor.

The power distributor is manufactured in the following manner. That is, as shown in FIG. 3, a single metal plate is stamped out to form an original plate shaped in a manner that the respective terminals 10, 12, 17 and the drain coupling plate 20 are mutually coupled by coupling portions 13 of small widths, then a resin mold is formed at the outer side of the metal plate thus stamped and the coupling portions are cut. The resin mold constitutes the casing 22 of the power distributor.

Figure 5A:
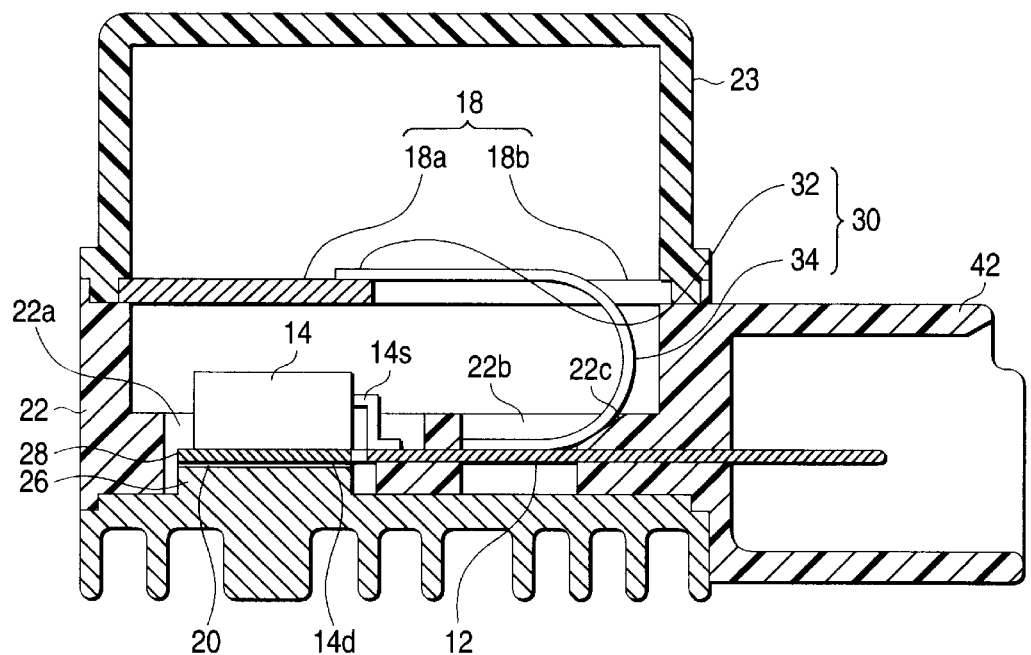
FIG. 5A is a cross-sectional front view showing the power distributor.
Figure 5B:
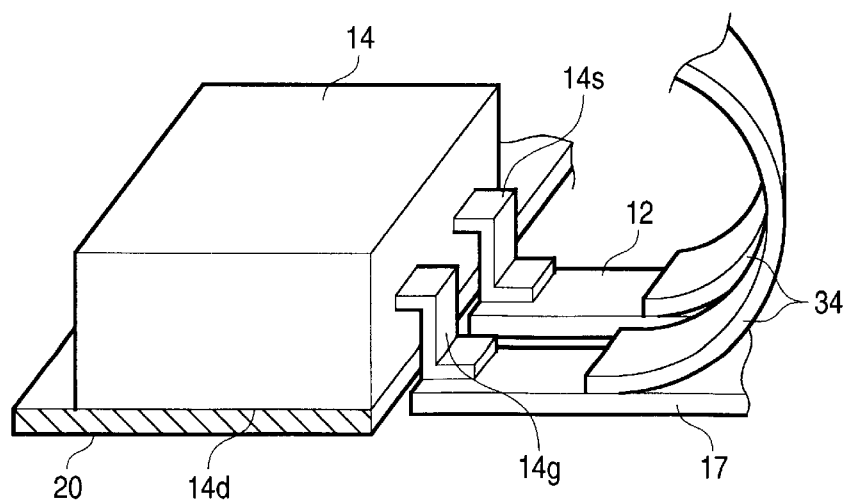
FIG. 5B is a perspective view showing coupling portions of a flexible wiring member to an output terminal and a control terminal in the power distributor.

As also shown in FIGS. 5A and 5B, the casing 22 includes a window 22a which is opened above and below the drain coupling plate 20 and a window 22b which is opened above and below the intermediate portions of the output terminals 12 and the control terminals 17. The coupling portions 13 are cut through these windows 22a and 22b. The FETs 14 are mounted by using the upper space of the window 22a. Each of the input terminal 10 and the output terminals 12 is arranged to penetrate the side wall of the casing 22 and protrude horizontally to the outside of the casing 22.

A heat dissipation member 24 is attached to the lower surface of the casing 22 so as to cover the lower surface.

The heat dissipation member 24 is entirely and integrally formed by material with a high thermal conductivity (or a large specific heat) such as aluminum alloy, copper alloy etc. Many line-shaped fins 25a are formed in parallel from one another on the lower surface (the surface exposed to the outside of the power distribution portion) of the heat dissipation member 24.

A table portion 26 is formed on the upper surface of the heat dissipation member 24 in a shape protruding upward and extending in the direction in parallel to the arrangement direction of the FETs 14. The rear surface of the drain coupling plate 20 is coupled to the upper surface of the table portion 26 through an insulating sheet 28 made of silicon etc. so as to be able to transmit heat therebetween.

Each of the terminals 10, 12 and 17 may not be necessarily disposed on the same plane but may be separately disposed on plural planes stacked vertically. However, when the respective terminals are disposed on the substantially same plane, the power distributor can be made thin. Further, when the respective terminals are disposed on the substantially same plane and integrated by the resin mold, the power distributor which has a simple structure and is handled easily can be configured.

In the power distributor, many board terminals 16A, 16B for connecting the control circuit board 18 to an external circuit (a circuit provided at the outside of the power distributor) are separately disposed at two stages stacked vertically, at the side portion of the input terminal 10 and the output terminals 12, and are molded integrally with the casing 22.

Figure 4A:
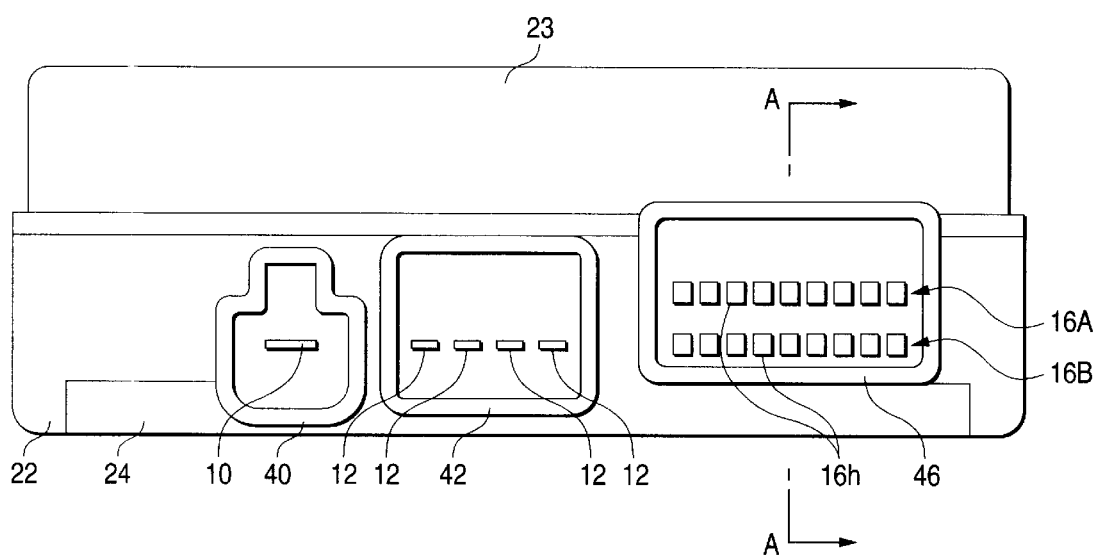
FIG. 4A is a side view showing the power distributor.
Figure 4B:
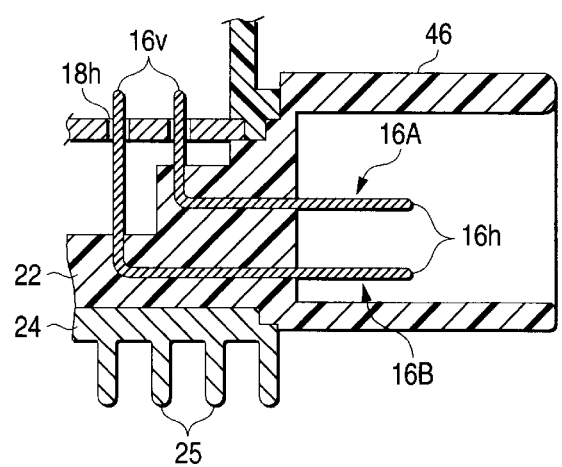
FIG. 4B is a cross-sectional view showing the power distributor taken along a line A—A of FIG. 4A.

Each of the board terminals 16A, 16B is formed by bending a metal pin at the center portion thereof to form almost a right angle between the bent portions. That is, as shown in FIG. 4B, each of the board terminals 16A, 16B is configured in an L shape by integrally forming a horizontal portion 16h extending in the horizontal direction and a vertical portion 16v extending vertically. Further, each of the board terminals 16A, 16B is molded to the casing in a state that the horizontal portion 16h penetrates the side wall of the casing 22 to protrude in the side direction thereof and the vertical portion 16v penetrates the top wall of the casing 22 to protrude in the upper direction thereof.

Figure 6:
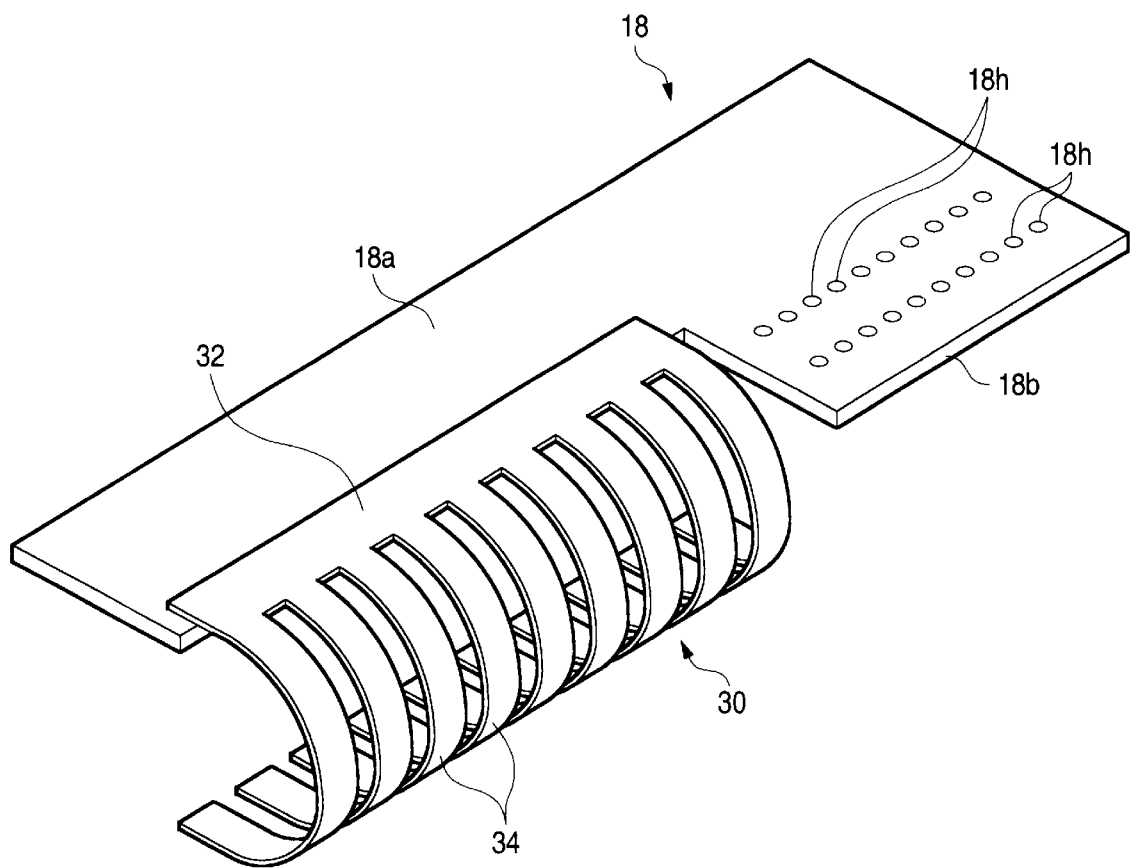
FIG. 6 is a perspective view showing a control circuit board disposed in the power distributor and the flexible wiring member connected to a control circuit board.

As shown in FIGS. 5A, 5B and 6, the control circuit board 18 includes a main body portion 18a extending to the terminal arrangement direction and a terminal coupling portion 18b which protrudes in the forward direction from the end portion of the one side of the main body portion 18a (the end portion on the side where the board terminal 16 is positioned). The control circuit board is fixed to the casing 22 so as to be positioned just above the FETs 14 in a state almost being in parallel to the plane on which the input terminal 10 and the output terminals 12 are disposed (that is, an almost horizontal state in the figures). To be more concrete, the control circuit board 18 is placed on the upper end of the casing 22 and a cover 23 is attached to the casing 22 side from the upper direction of the control circuit board, whereby the control circuit board is fixed to the casing in a manner that the control circuit board 18 is sandwiched between the cover 23 and the casing 22.

Many through holes 18h are provided at the terminal coupling portion 18b of the control circuit board 18 so as to penetrate the terminal coupling portion in the direction perpendicular to the surface thereof. The vertical portions 16v of the board terminals 16 are electrically connected and mutually fixed to the control circuit of the control circuit board 18 by a means such as the soldering process etc. in a state that the through holes 18h penetrate the vertical portions 16v, respectively.

The control circuit of the control circuit board 18 is electrically connected to the input terminal 10, the output terminals 12 and the control terminals 17 through a sheet of member 30. The member 30 is configured in a thin sheet shape and formed integrally by a base portion 32 extending in the direction in parallel to the terminal arrangement direction and branched portions 34 which are branched in correspondence to the respective terminals 10, 12, 17 from the base portion 32. The base portion 32 is fixed toe the front edge portion of the main body portion 18a of the control circuit board 18 by the soldering process etc. and electrically connected to the control circuit. The branched portions 34 are fixed and electrically connected to the upper surfaces of the terminals 10, 12, 17 by the soldering process etc. in a state bent by about 180°, respectively. A slanted surface is formed at the peripheral portion of the window 22a of the casing 22 so as to smoothly guide the bent member 30 to the output terminals 12, 17.

The member 30 may be formed by material that can realize the electrical connection while being bent. For example, the flexible wiring member may be preferably formed by an FPC (flexible printed circuit) which is formed by incorporating a printed circuit in a thin insulating sheet or an FFC (flexible flat cable) which is formed by integrating a plurality of flat rectangular conductors by insulating material in a state that the conductors are aligned in a flat manner.

At the outer side surface of the side wall of the casing 22, an input connector housing portion 40 covering the protruding portion of the input terminal 10, an output connector housing portion 42 covering the protruding portions of all the output terminals 12 and a board coupling connector housing portion 46 covering the protruding portions of the horizontal portions 16v of all the board terminals 16 are integrally formed with the casing 22. The housing of the connector of a power source coupling wire harness is coupled to the input connector housing portion 40, so that the input terminal 10 is coupled to the power source side through the power source coupling wire harness. The housing of the connector of a load coupling wire harness is coupled to the output connector housing portion 42, so that the output terminals 12 are coupled to the vehicle-mounted loads through the load coupling wire harness, respectively. The housing of the connector of a board coupling wire harness is coupled to the board coupling connector housing portion 46, so that the board terminals 16 are coupled to the external circuit (a circuit for applying a command signal to the control circuit board 18 and a circuit for receiving an alarm signal from the control circuit board 18 and performing an alarm operation) through the board coupling wire harness.

That is, portions of the input terminal 10, the output terminals 12 and the horizontal portions 16v of the terminals protruding to the outside of the casing 22 form an input connector, output connectors and board coupling connectors, respectively.

The action of the electric coupling box will be explained.

Electric power outputted from a not-shown vehicle-mounted battery is inputted to the input terminal 10 through the power source coupling wire harness and distributed to the drain terminals 14d of the respective FETs 14. Then, the electric power inputted only to the drain terminals 14d of the FETs 14 in an on state is supplied to the corresponding vehicle-mounted loads through the output terminals 12 and the load coupling wire harness, respectively.

The operation signal (for example, the switch signal) sent from the external circuit is inputted to the control circuit of the control circuit board 18 through the board coupling wire harness and the board terminals 16. The control circuit inputs control signals to the gate terminals 14g of the FETs 14 through the member 30 and the control terminals 17 in accordance with the operation signal, respectively, to thereby control the on-off switching of the conduction between the drain and the source of each of the FETs 14. When the FET 14 is switched in an off state, the power supply to the output terminal 12 coupled to the source terminal 14s of this FET 14 is cut off.

Further, the voltages of the input terminal 10 and the respective output terminals 12 are inputted into the control circuit through the same member 30. The control circuit obtains current values flowing into the respective FETs 14 based on the voltage differences between the input terminal and the respective output terminals and, when the current value thus obtained is equal to or more than a predetermined value, controls the corresponding FET 14 to forcedly turn it off.

According to the aforesaid power distributor for a vehicle, since the FETs 14 serving as the semiconductor switching elements are disposed separately from the control circuit board 18, such a phenomenon can be prevented from occurring that heat generated from the FETs 14 badly influences on other circuit elements on the control circuit board 18. Further, when the heat dissipation member 24 shown in the figure is provided, for example, the positive cooling operation of the FETs 14 can be performed with a simple configuration.

Further, all the required terminals 10, 12, 17, 16 are disposed on the one sides of the FETs 14 and the drain coupling plate 20 so as to be in parallel to the arrangement direction of the FETs 14, and the end portions of the respective terminals protrude from the casing 22 to directly form the connector. Thus, while the control circuit board 18 is separately disposed from the FETs 14 as described above, the respective sizes (in particular, the sizes along the direction perpendicular to the arrangement direction of the FETs 14) can be reduced remarkably, so that the entire size of the power distributor can be reduced.

The invention is not limited to the aforesaid embodiment and may employ the following modifications.

The semiconductor switching elements employed in the invention are not limited to the power MOSFETs but various kinds of semiconductor elements having a switching function such as other transistors (for example, IGBTs or usual bipolar transistors) or various kinds of thyristors such as GTOs may be employed in accordance with the specifications. Further, such semiconductor switching elements are not limited to package elements but may be ones formed by directly mounting semiconductor chips. The coupling method between the semiconductor switching elements and the respective terminals are not limited to particular one, and the wire bonding, for example, may be employed suitably at some coupling portions between the semiconductor switching elements and the respective terminals.

Further, according to the invention, the numbers and the arrangements of the respective semiconductor switching elements and the output terminals may be set suitably and, in particular, may be set freely depending on the numbers and the arrangements of the respective electric equipments disposed within a vehicle.

Although, in the power distributor of the aforesaid embodiment, the drain coupling plate 20 and the input terminal 10 are formed by the same signal metal plate, the drain coupling plate and the input terminal may be formed by different members separately and coupled to each other by the welding process etc. Further, the input side conduction terminals of the respective semiconductor switching elements may be separately coupled to the input terminal without using the drain coupling plate 20. However, according to the configuration of the embodiment, the electric coupling between the respective semiconductor switching elements and the input terminal as well as the cooling operation of the respective semiconductor switching elements can be performed efficiently by using the drain coupling plate 20, so that the power distributor can be miniaturized remarkably.

In the invention, the heat dissipation member 24 is not necessarily required. Further, in the case of providing the heat dissipation member 24, the configuration and the arrangement thereof may be suitably set. However, when the heat dissipation member 24 is coupled to the drain coupling plate 20 on which the respective FETs 14 are mounted so as to be able to transmit the heat therebetween (however electrically insulated therebetween) as shown in the drawings, the respective FETs 14 can be cooled positively with a high efficiency.

As described above, according to the invention, the semiconductor switching elements are disposed in one direction; the control circuit board is provided thereon; and the input terminal, the output terminals and the board terminals are disposed in parallel to the arrangement direction of the semiconductor switching elements and protruded from the casing in the same direction so that these terminals directly form the connector. Thus, since the semiconductor switching elements are disposed separately from the control circuit board, the thermal influence on the control circuit board can be suppressed, and the entire configuration of the power distributor can be simplified to a large extent and miniaturized.

What is claimed is:

1. A power distributor for a vehicle for distributing electric power supplied from a power source mounted on the vehicle to a plurality of vehicle-mounted loads, said distributor comprising:

an input terminal coupled to the power source;

a plurality of output terminals coupled to the vehicle-mounted loads, respectively;

semiconductor switching elements disposed between said input terminal and said plurality of output terminals, respectively;

a control circuit board disposed above said semiconductor switching elements and having a control circuit which controls on and off states of each of said semiconductor switching elements according to a command signal inputted from outside;

board terminals that electrically connect said control circuit to an external circuit; and a casing for housing therein said semiconductor switching elements and said control circuit board;

wherein said semiconductor switching elements are disposed in one direction;

wherein said input terminal, said output terminals and said board terminals are disposed in parallel to an arrangement direction of said semiconductor switching elements; and wherein said input terminal, said output terminals and said board terminals protrude in the same direction from said casing.

2. The power distributor for a vehicle according to claim 1, wherein conduction control terminals of said semiconductor switching elements are coupled to said control circuit of said control circuit board through a flexible wiring member.

3. The power distributor for a vehicle according to claim 2, further comprising control terminals disposed alternately with said output terminals and electrically coupled to said conduction control terminals of said semiconductor switching elements, respectively;

wherein said control terminals are coupled to said control circuit of said control circuit board through the flexible wiring member.

4. The power distributor for a vehicle according to claim 2, wherein all of said conduction control terminals are electrically connected to said control circuit by a sheet of the flexible wiring member.

5. The power distributor for a vehicle according to claim 4, wherein said conduction control terminals and said control circuit are electrically coupled to each other, said control circuit is electrically coupled to said input terminal and said output terminals through said flexible wiring member, and said control circuit is arranged to, when a current value obtained from a voltage difference between said input terminal and one of said output terminals is equal to or more than a predetermined value, forcedly turn off said semiconductor switching element coupled to said one of said output terminals.

6. The power distributor for a vehicle according to claim 1, wherein said board terminals are bent to form a substantially right angle between bent portions;

wherein one ends of said board terminals are coupled to said control circuit of said control circuit board and other ends of said board terminals are disposed to protrude in a same direction as said input terminal and said output terminals.

7. The power distributor for a vehicle according to claim 1, wherein at least one connector housing portion covering said input terminal, said output terminals and said board terminals is formed integrally with one side surface of a main body of said casing.

8. The power distributor for a vehicle according to claim 1, wherein said semiconductor switching elements, said input terminal and said output terminals are disposed on a substantially same plane, and said control circuit board is disposed substantially in parallel to said plane.

9. The power distributor for a vehicle according to claim 8, further comprising a conduction plate on which said semiconductor switching elements are mounted and which is electrically coupled to input side conduction terminals of said semiconductor switching elements;

wherein said conduction plate and said input terminal are formed by a common single metal plate.

10. The power distributor for a vehicle according to claim 8, wherein said input terminal, said output terminals and said board terminals are molded integrally with said casing.

11. The power distributor for a vehicle according to claim 1, wherein a heat dissipation member is fixed to a lower surface of said casing in a state that said heat dissipation member is exposed outside of said casing; and wherein said heat dissipation member is coupled to said semiconductor switching elements so as to transmit heat from said semiconductor switching elements.

* * * * *